(12) United States Patent
Ganesan et al.

(10) Patent No.: US 6,833,730 B1
(45) Date of Patent: Dec. 21, 2004

(54) PLD CONFIGURABLE LOGIC BLOCK ENABLING THE RAPID CALCULATION OF SUM-OF-PRODUCTS FUNCTIONS

(75) Inventors: Satish R. Ganesan, Mountain View, CA (US); Amit Kasat, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 54 days.

(21) Appl. No.: 10/233,244

(22) Filed: Aug. 30, 2002

(51) Int. Cl.[7] .................................... H03K 19/177
(52) U.S. Cl. ............................... 326/41; 326/47
(58) Field of Search .................... 326/38–41

(56) References Cited

U.S. PATENT DOCUMENTS

| | | | | |
|---|---|---|---|---|
| 6,118,300 A | * | 9/2000 | Wittig et al. | 326/41 |
| 6,150,838 A | | 11/2000 | Wittig et al. | |
| 6,191,610 B1 | * | 2/2001 | Wittig et al. | 326/38 |
| 6,191,683 B1 | * | 2/2001 | Nygaard, Jr. | 340/146.2 |
| 6,396,302 B2 | | 5/2002 | New et al. | |
| 6,400,180 B2 | | 6/2002 | Wittig et al. | |

OTHER PUBLICATIONS

U.S. patent application Ser. No. 09/687,812, Kaviani, filed Oct. 13, 2000.
"Virtex–II Platform FPGA Handbook"; published Dec. 2000; available from Xilinx, Inc. 2100 Logic Drive, San Jose, CA 95124; pp. 33–75.

* cited by examiner

*Primary Examiner*—Vibol Tan
(74) *Attorney, Agent, or Firm*—Lois D. Cartier

(57) ABSTRACT

A variety of CLB architectures enable the efficient implementation of sum-of-products functions in a PLD. Output signals from each lookup table (LUT) in a CLB are routed directly to a dedicated OR structure, bypassing other logic typically included in a CLB. Thus, the LUTs can be programmed to implement AND functions, with the AND function results being ORed together in the dedicated OR structure. In this manner, a fast and efficient sum-of-products output signal is provided. In some embodiments, the dedicated OR structure includes programmable means for selectively combining the signals from the LUTs. In these embodiments, LUTs with output signals that are ignored by the dedicated OR structure can be used to implement unrelated logic.

29 Claims, 14 Drawing Sheets

US 6,833,730 B1

PLD CONFIGURABLE LOGIC BLOCK ENABLING THE RAPID CALCULATION OF SUM-OF-PRODUCTS FUNCTIONS

FIELD OF THE INVENTION

The invention relates to Programmable Logic Devices (PLDs). More particularly, the invention relates to a configurable logic block (CLB) for a PLD that enables the rapid calculation of sum-of-products (SOP) functions.

BACKGROUND OF THE INVENTION

Programmable logic devices (PLDs) are a well-known type of digital integrated circuit that can be programmed to perform specified logic functions. One type of PLD, the field programmable gate array (FPGA), typically includes an array of configurable logic blocks (CLBs) surrounded by a ring of programmable input/output blocks (IOBs). The CLBs and IOBs are interconnected by a programmable interconnect structure. Some FPGAs also include additional logic blocks with special purposes (e.g., DLLs, RAM, and so forth).

The CLBS, IOBS, interconnect, and other logic blocks are typically programmed by loading a stream of configuration data (bitstream) into internal configuration memory cells that define how the CLBS, IOBS, and interconnect structure are configured. The configuration data can be read from memory (e.g., an external PROM) or written into the FPGA by an external device. The collective states of the individual memory cells then determine the function of the FPGA.

Other PLDs are programmed by applying a processing layer, such as a metal layer, that programmably interconnects the various elements on the device. These PLDs are known as ASIC devices (Application Specific Integrated Circuits). PLDS can also be implemented in other ways, e.g., using fuse or antifuse technology.

One type of PLD is the Virtex™-II family of FPGAs from Xilinx, Inc. (The Virtex-II FPGA is described in detail in pages 33–75 of the "Virtex-II Platform FPGA Handbook", published December, 2000, available from Xilinx, Inc., 2100 Logic Drive, San Jose, Calif. 95124, which pages are incorporated herein by reference.) A Virtex-II FPGA includes an array of configurable logic blocks (CLBs) as described above. FIG. 1 is a simplified diagram of a Virtex-II CLB.

As shown in FIG. 1, a Virtex-II CLB includes four similar slices, SLICEs 0 through SLICE 3. Each slice includes two lookup tables (LUT 1, LUT 2). Each LUT has an associated carry multiplexer (CY1, CY2), two associated multiplexers (M1 and MX1, M2 and MX2), and an associated flip-flop (FF1, FF2). By programming the various multiplexers, each LUT output can be provided as a slice output signal and/or can be registered in the associated flip-flop. Each LUT output can also be placed on the carry chain or can alter a value already present on the carry chain. These aspects of CLBs are well known, and therefore are not described further herein.

However, each Virtex-II slice also includes an "SOP chain", or sum-of-products chain. The SOP chain includes a multiplexer ORM that selects between an OR-input signal (e.g., OIN0) and a logic low level ("0") under the control of a configuration memory cell (not shown). The output of multiplexer ORM is ORed together with the carry chain output COUT for the slice in OR gate "OR". The output of OR gate "OR" is passed along the SOP chain to multiplexer ORM in the adjacent slice.

Note that in the present specification, the same reference characters are used to refer to terminals, signal lines, and their corresponding signals. Further, in CMOS logic an OR gate is typically implemented as a NAND-gate with inverted input signals. However, in the present specification the "OR" symbol is used to simplify the drawings and to accurately represent the logical function. The term "OR gate" is also used herein to represent logic implementing the OR function, however implemented.

The SOP chain of FIG. 1 can be used to implement sum-of-products functions, as shown in FIG. 1A. For example, to implement a sum-of-products function each LUT (LUT 1, LUT 2 in each slice) is programmed to implement an AND function. The carry chain (CY1, CY2 in each slice) is then used to combine the AND functions into wider AND functions, as shown in FIG. 1A. The OR gates in the SOP chain (gate "OR" in each slice) are then combined to provide the sum-of-products output signal, AND16OR2. Thus, as shown in FIG. 1A, a single Virtex-II CLB can be used to implement a 2-input OR function of two 16-input AND functions (i.e., the sum-of-products function of two product terms, each with 16 inputs). Additional inputs can be added to each AND function (i.e., to each product term) by extending the carry chains into vertically adjacent CLBs. Additional inputs can be added to each OR function by extending the SOP chain into horizontally adjacent CLBs.

While the CLB architecture of FIG. 1 enables the efficient implementation of sum-of-products functions, the speed of the computation is limited by the speed of the carry chain. In particular, getting "onto" and "off of" a carry chain typically carries a significant delay penalty. Alireza S. Kaviani proposes an alternative CLB architecture that bypasses the carry chain in commonly assigned, co-pending U.S. patent application Ser. No. 09/687,812, entitled "Configurable Logic Block for PLD" and filed Oct. 13, 2000, which is hereby incorporated herein by reference. This alternative architecture is illustrated in FIG. 2.

The CLB of FIG. 2 includes four similar slices, each slice (SLICE 0 through SLICE 3) being similar to those shown in FIG. 1. However, in the architecture of FIG. 2, each slice includes an additional function generator FG. Function generator FG can be configured (e.g., by bits stored in configuration memory cells, not shown) to implement either a 2-input NOR function of the two LUT output signals, a 2-input NAND function of the two LUT output signals, a constant high value generator, or to pass another value supplied from elsewhere inside the CLB. To implement a sum-of-products function, function generator FG is configured to function as a 2-input NOR gate.

As shown in FIG. 2A, each LUT in slices SLICE 1 and SLICE 3 is configured as a NAND gate. The function generator FG of each slice is configured as a 2-input NOR gate. As is well known in the art of logic design, two NAND gates followed by a NOR gate are logically equivalent to a single wide AND gate. Therefore, the output of each function generator FG is the AND function of all eight LUT inputs for that slice, i.e., an 8-input product term. The product terms are then combined together in the SOP chain as in the CLB architecture of FIG. 1.

This architecture avoids the delay of the carry chain. Instead, the delay from a LUT output to the SOP chain (i.e., to an input terminal of one of the OR gates in the chain) is only the delay through function generator FG. However, the architecture of FIG. 2 also has its limitations. For example, the removal of the carry chain has resulted in a maximum of 8 AND inputs, rather than the virtually unlimited number of inputs supported in FIG. 1. Further, the delay from a LUT input terminal to the AND8OR2 output terminal includes not only the delay through the FG function generator, but an additional delay of up to two OR gate delays.

Therefore, Kaviani further proposes a second alternative CLB architecture, which is also disclosed in commonly assigned, co-pending U.S. patent application Ser. No. 09/687,812. In the architecture of FIG. 3, each slice includes the function generator FG as in FIG. 2. However, the SOP chain is omitted. Instead, the CLB includes a dedicated 4-input OR gate 301 that performs a logical OR function of the four output signals (OUT0–OUT3) from the four function generators FG of the four slices in the CLB. (The term "dedicated" is used herein to describe a circuit designed to perform a single function, e.g., an OR function, as opposed to a circuit that can be programmed to implement any of a variety of functions. For example, OR gate 301 is a dedicated circuit, while function generator FG is not.)

Using the architecture of FIG. 3, a sum-of-products function can be implemented as shown in FIG. 3A. Each LUT is configured as a NAND gate, as in the architecture of FIG. 2. Each function generator FG is configured as a NOR gate. Thus, each function generator FG provides the AND function of all eight LUT inputs for that slice, e.g., an 8-input product term. The four product terms AND0–AND3 are then combined together in OR gate 301 as shown in FIG. 3A, to provide sum-of-products output signal AND8OR4.

The architecture of FIG. 3 includes neither the carry chain delay nor the SOP chain delay resulting from previous architectures (see FIGS. 1A and 2A). The delay between a LUT output signal and the output terminal AND8OR4 includes a single FG function generator delay and the delay through dedicated OR gate 301. However, it is desirable to further reduce the delay on the logic path, to enhance the performance of sum-of-products functions implemented in a programmable logic device.

SUMMARY OF THE INVENTION

The invention provides a variety of configurable logic block (CLB) architectures that enable the efficient implementation of sum-of-products functions in a programmable logic device (PLD). Output signals from each lookup table (LUT) in a CLB are routed directly to a dedicated OR structure, bypassing other logic (such as carry chains, other function generators, and so forth) typically included in a CLB. The dedicated OR structure logically "ORs" together the signals from the LUTs. Thus, the LUTs can be programmed to implement AND functions, with the AND function results being ORed together in the dedicated OR structure, thereby providing a fast and efficient sum-of-products output signal.

In some embodiments, the dedicated OR structure includes programmable means for selectively combining the signals from the LUTs. The dedicated OR structure can include, for example, a 2-input multiplexer on each input terminal, each multiplexer selecting between an associated LUT output signal and a ground (logic low) signal. In one embodiment, the multiplexer is controlled by a configuration signal stored in a configuration memory cell coupled to a select terminal of the multiplexer. Clearly, the ground signal, when selected, is ignored by the dedicated OR structure. Thus, any LUT with a "blocked" output signal (i.e., any LUT having an associated multiplexer configured to select the ground input signal) can be used for other purposes, such as to implement unrelated logic.

In one embodiment, a CLB includes eight LUTS, and the output signals from all eight LUTs are ORed together in a single 8-input dedicated OR structure.

In other embodiments, four LUT outputs are combined in a first dedicated OR structure, with the other four LUT outputs being combined in a second dedicated OR structure. In one such embodiment, the first and second dedicated OR structures both drive a logical OR circuit that provides the combined sum-of products output signal. In another such embodiment, the first and second dedicated OR structures are cascaded such that the output of the second dedicated OR structure includes the OR function of all eight LUTs. In some embodiments, the first dedicated OR structure can also receive an external signal from an input terminal of the CLB, or from another node within the CLB. In some embodiments, the output of the first dedicated OR structure is selectively passed to the second dedicated OR structure, so the CLB can optionally be used to implement two independent sum-of-products functions.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

The present invention is believed to be applicable to a variety of programmable logic devices (PLDs). The invention has been found to be particularly applicable and beneficial when applied to field programmable gate arrays (FPGAs). While the invention is not so limited, an appreciation of the invention is presented by way of specific examples in which the invention is applied to FPGAs. In these examples, numerous specific details are set forth to provide a more thorough understanding of the present invention. However, it will be apparent to one skilled in the art that the present invention can be practiced without these specific details.

Figure 1:
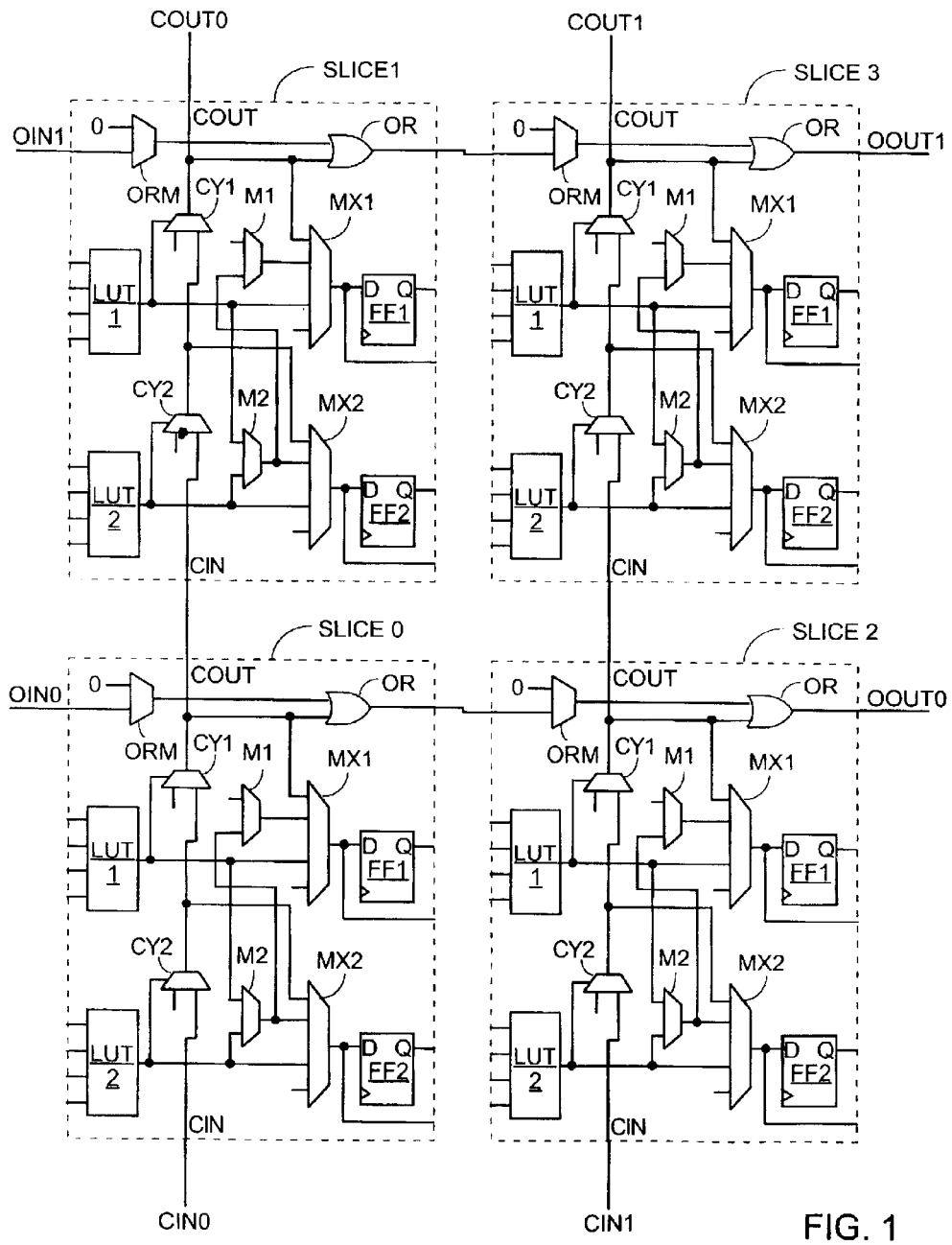
FIG. 1 is a simplified diagram of a Virtex-II CLB containing four similar slices.
Figure 1A:
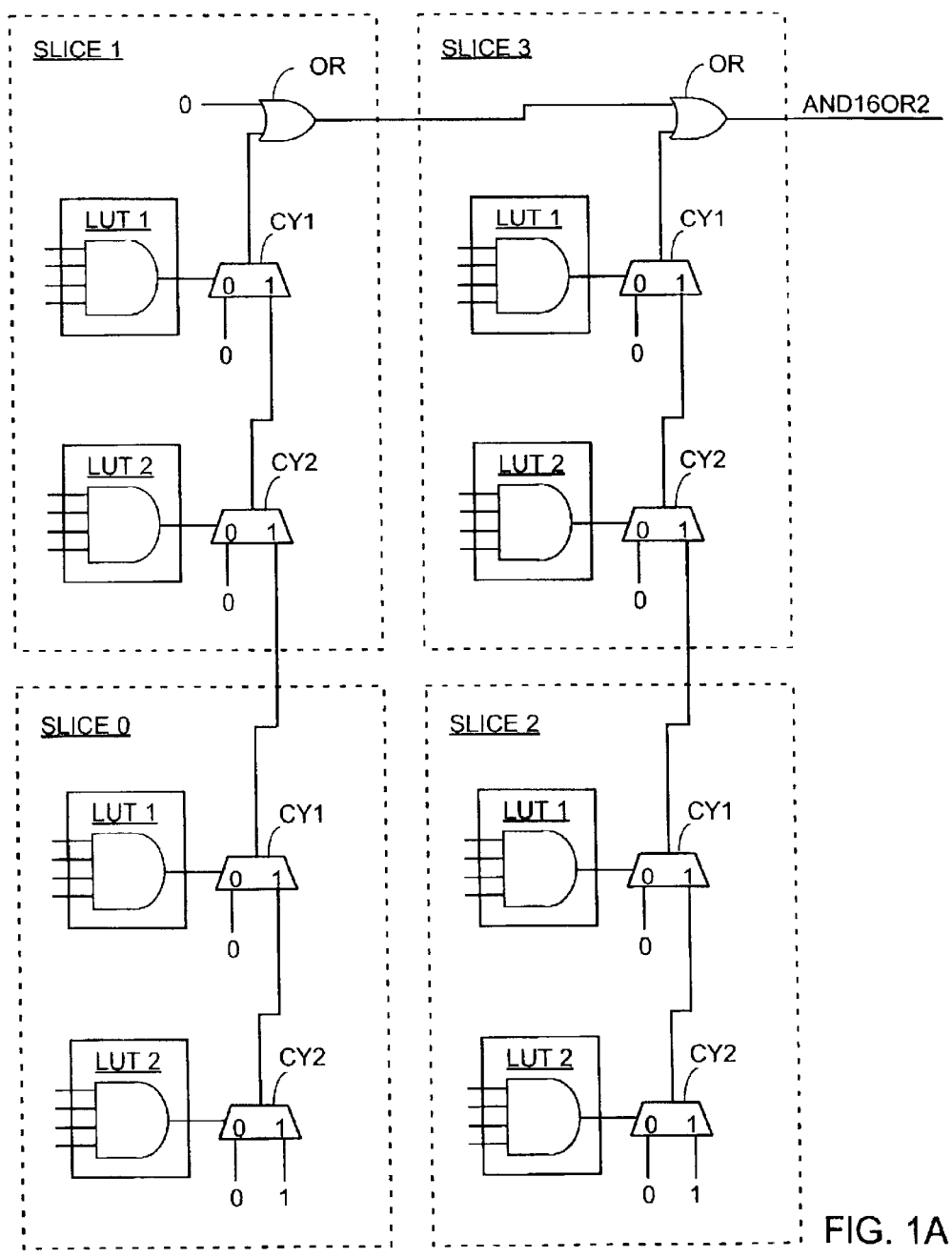
FIG. 1A illustrates the implementation of a sum-of-products function in the CLB of FIG. 1.
Figure 2:
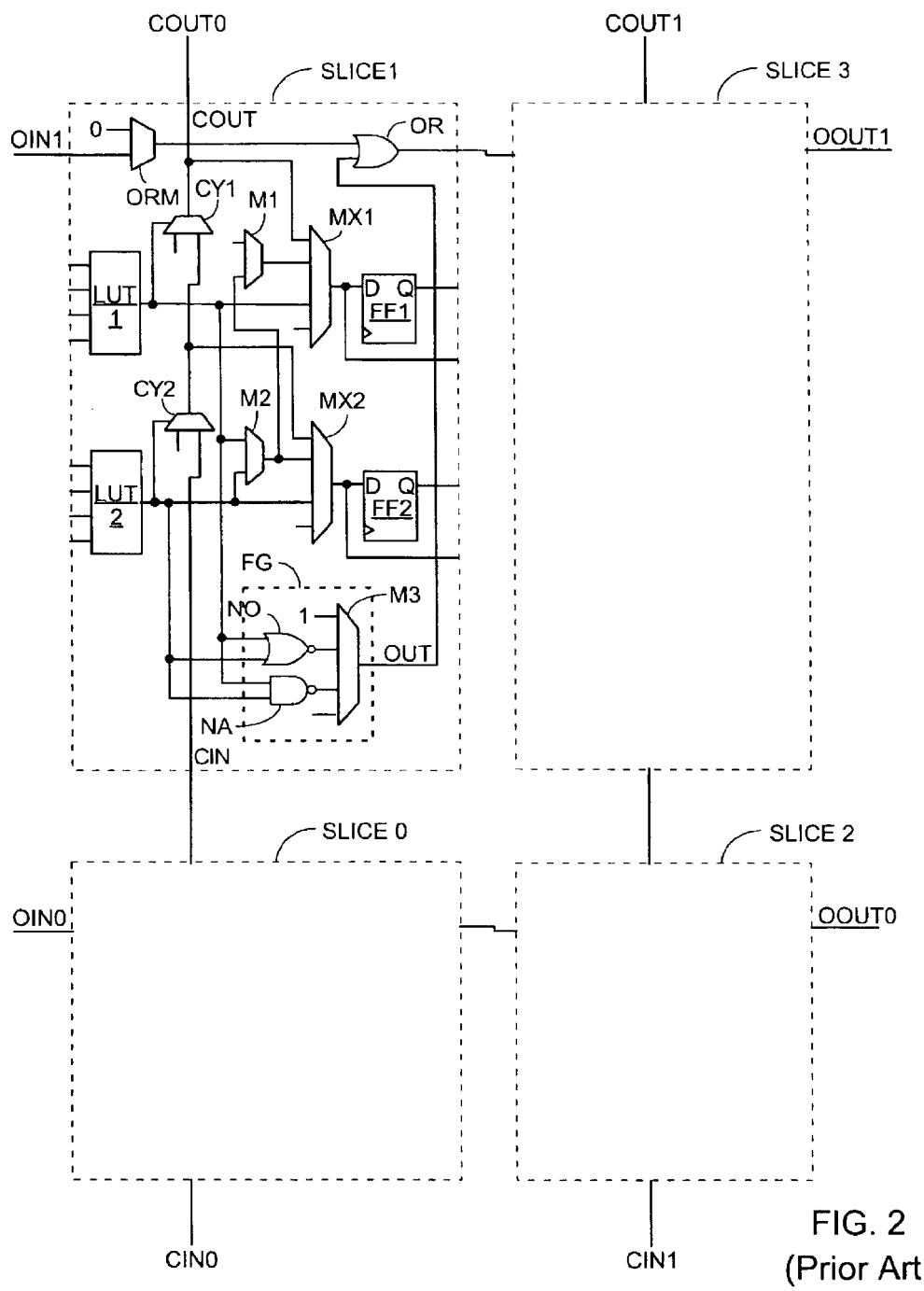
FIG. 2 is a simplified diagram of a first CLB architecture that has been proposed as an alternative to the CLB of FIG. 1.
Figure 2A:
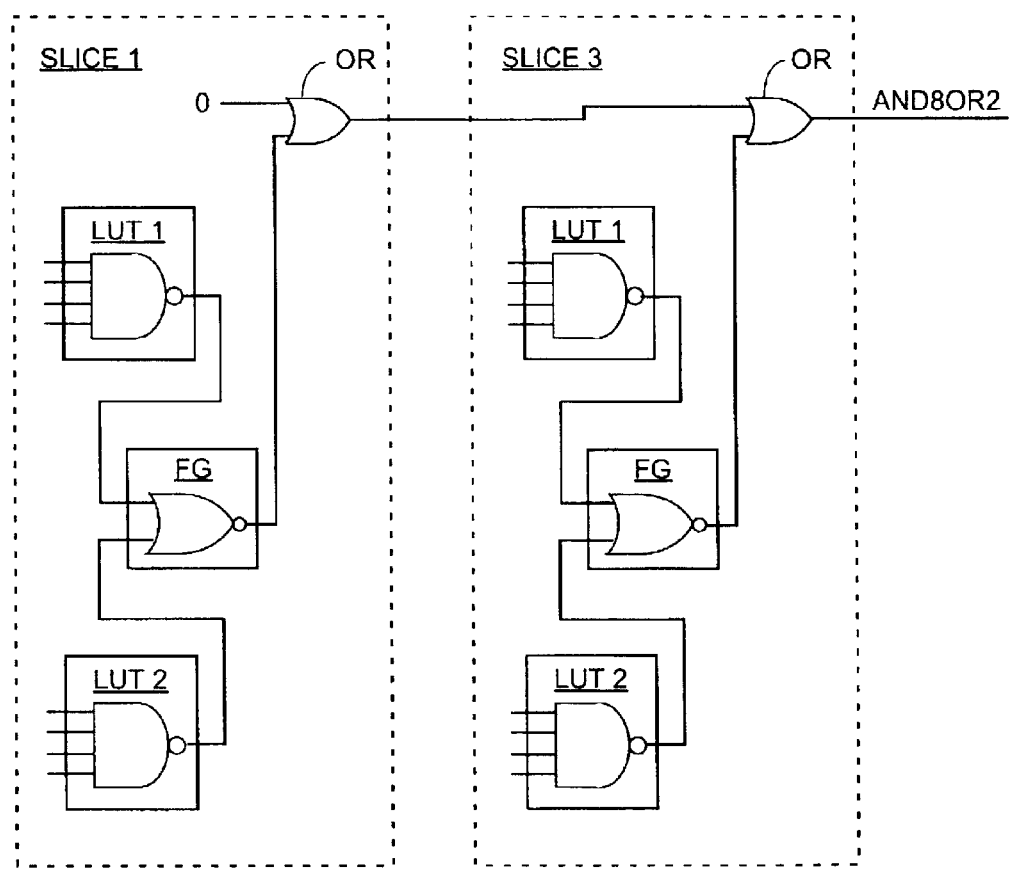
FIG. 2A illustrates the implementation of a sum-of-products function in the CLB of FIG. 2.
Figure 3:
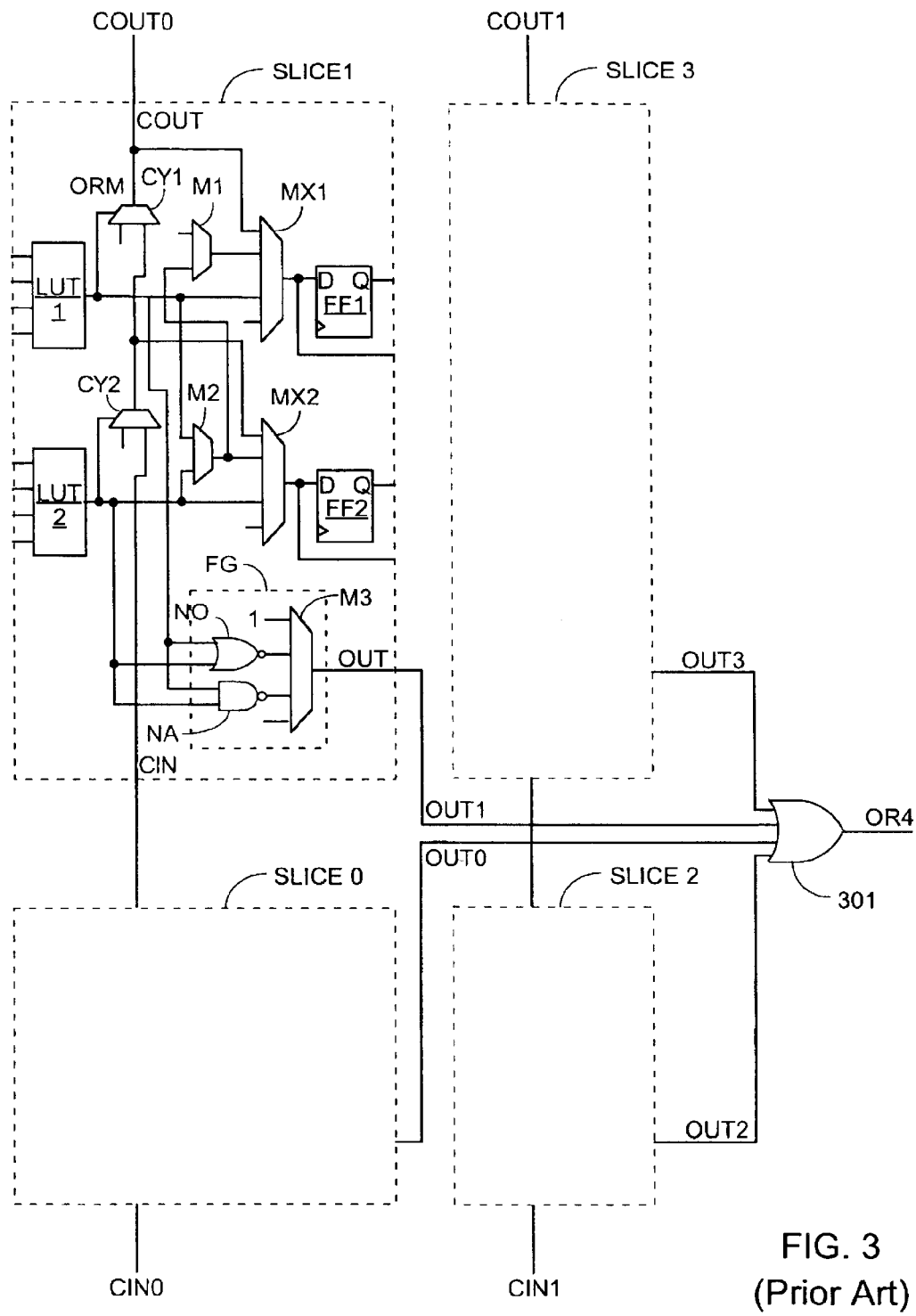
FIG. 3 is a simplified diagram of a second CLB architecture that has been proposed as an alternative to the CLBs of FIGS. 1 and 2.
Figure 3A:
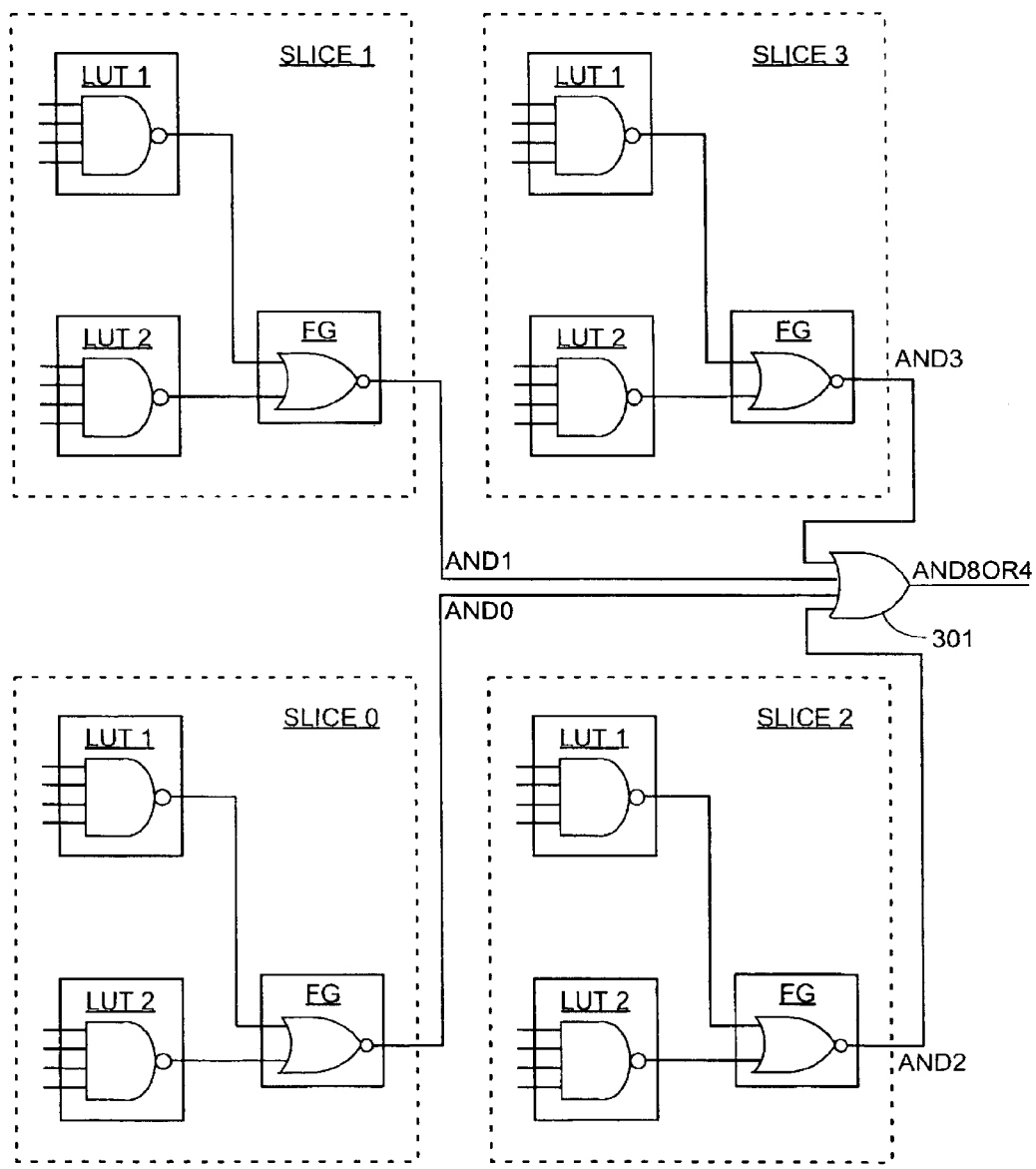
FIG. 3A illustrates the implementation of a sum-of-products function in the CLB of FIG. 3.
Figure 4:
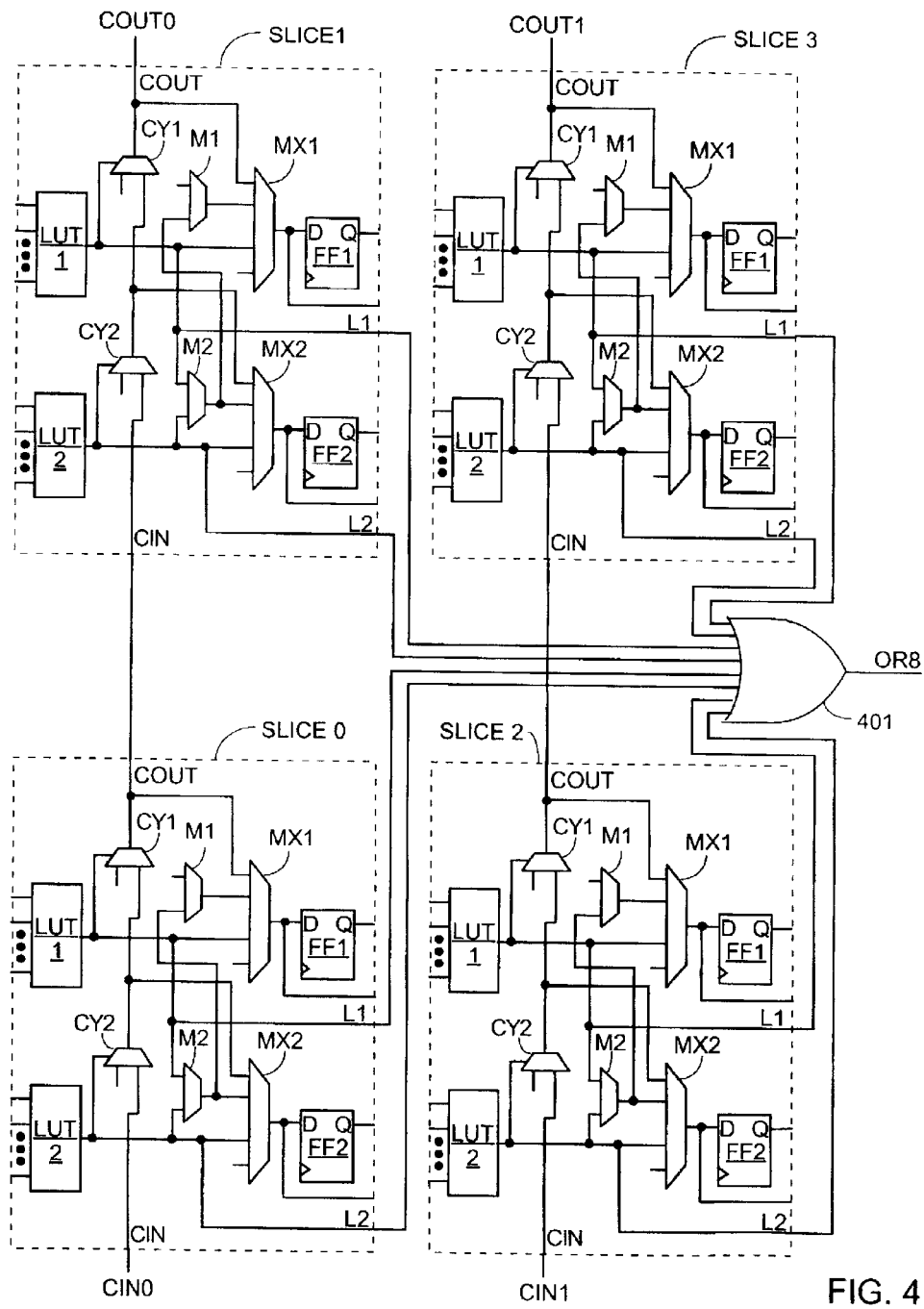
FIG. 4 is a simplified diagram of a first CLB architecture according to a first embodiment of the present invention.

FIG. 4 shows a first CLB architecture according to one embodiment of the invention. The CLB of FIG. 4 includes four slices similar to those of the Virtex-II CLB shown in FIG. 1. However, the SOP chains (multiplexer ORM and OR gate "OR" in each slice) are omitted. Further, the CLB of FIG. 4 does not include a function generator FG as in the proposed CLB architectures of FIGS. 2 and 3.

Instead, the output terminals of all eight LUTs are directly connected to input terminals of a dedicated OR structure 401, i.e., there is no intervening logic as in previously proposed CLB architectures. Thus, this connection is very fast. Dedicated OR structure 401 is also faster than a more generalized circuit, and in particular is faster than function generator FG (FIGS. 2, 3) followed by an OR gate (301 in FIG. 3) or a chain of OR gates and multiplexers (OR and ORM in FIG. 2).

Figure 4A:
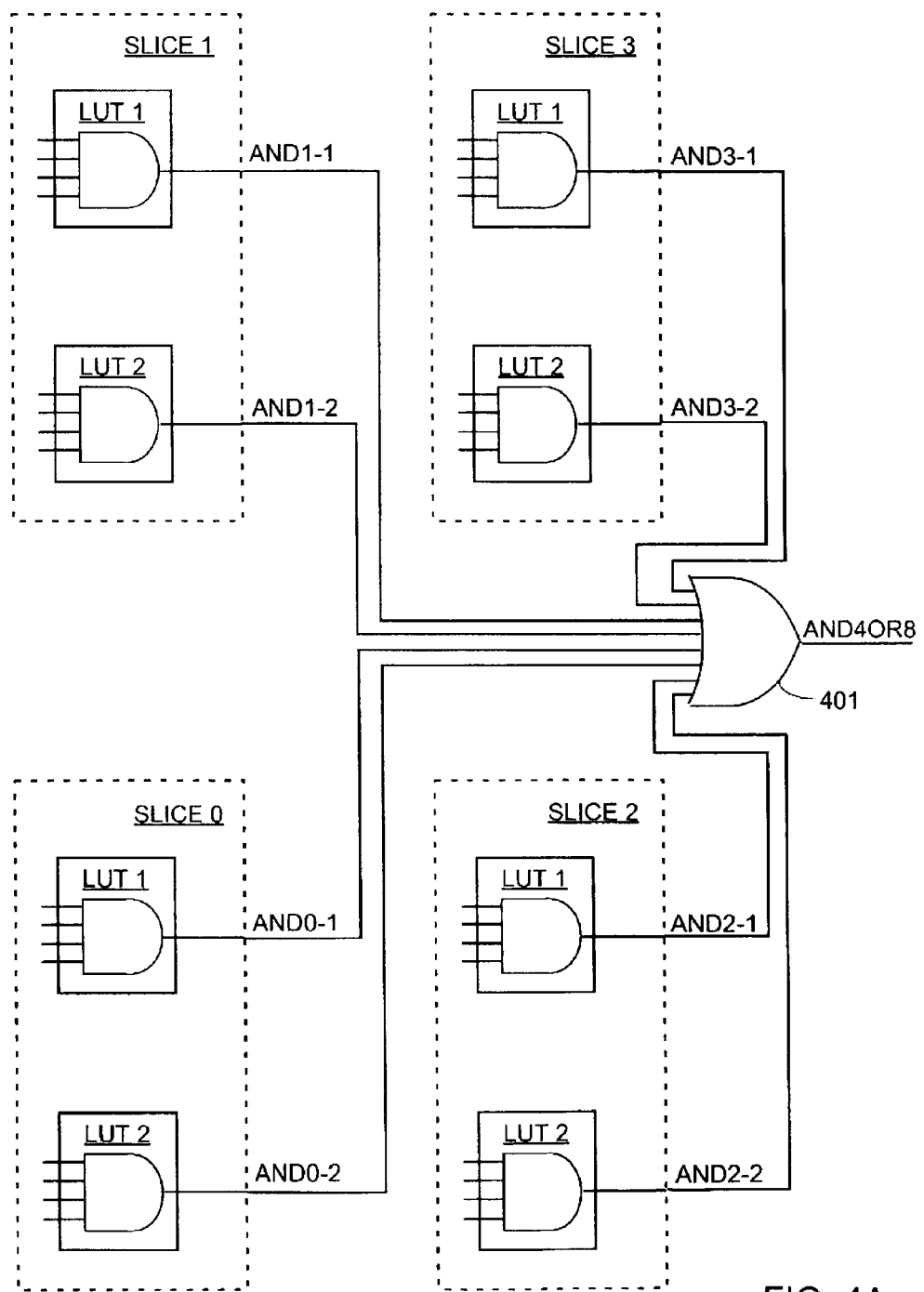
FIG. 4A illustrates the implementation of a sum-of-products function in the CLB of FIG. 4.

FIG. 4A shows how a sum-of-products function can be implemented in the CLB of FIG. 4. Each LUT is configured as an AND gate. The AND output signals (i.e., the product terms) are each passed to dedicated OR structure 401, which provides the sum-of-products output AND4OR8 for the CLB.

Figure 4B:
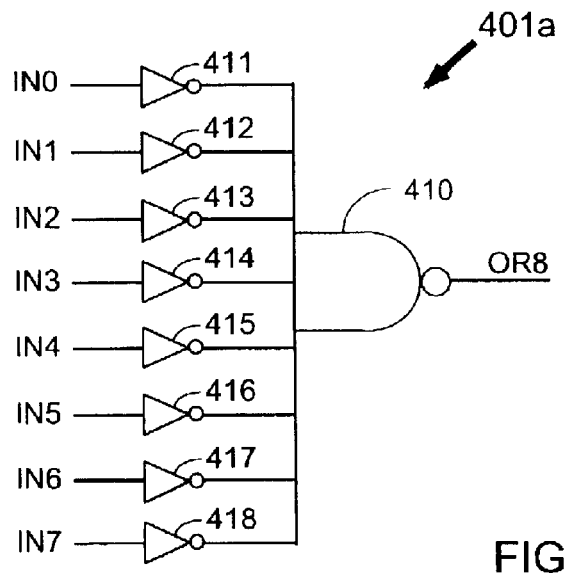
FIG. 4B shows a first implementation of a dedicated OR structure that can be used in the CLB of FIG. 4.

FIG. 4B shows one implementation 401a of dedicated OR structure 401. In CMOS logic, the OR function is most conveniently implemented as a NAND gate with inverted inputs. Thus, the 8-input dedicated OR structure of FIG. 4B includes an inverter 411–418 for each of the eight inputs signals IN0–IN7 and a NAND gate 410. Inverters 411–418 each drive NAND gate 410, which provides the output signal OR8.

Figure 4C:
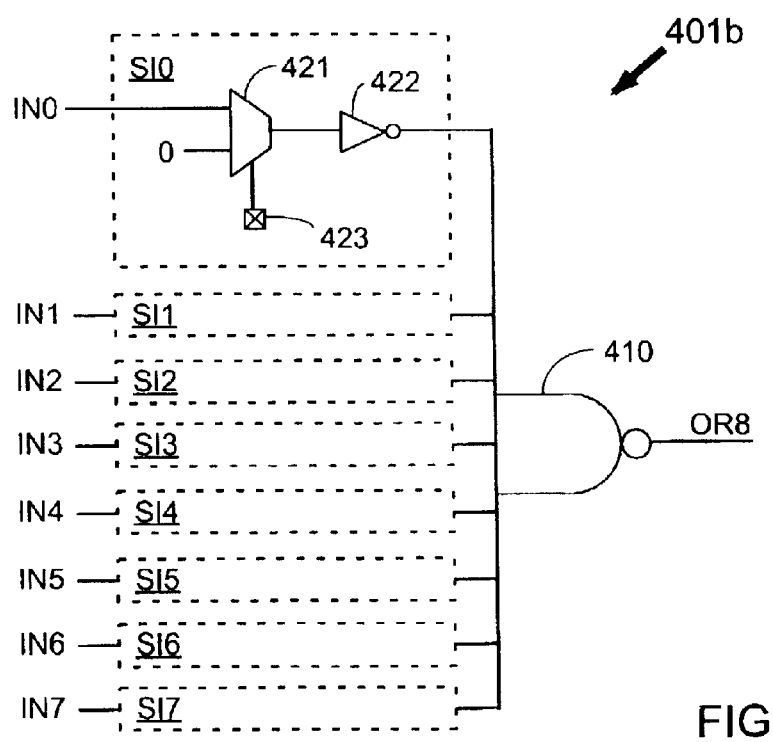
FIG. 4C shows a second implementation of a dedicated OR structure that can be used in the CLB of FIG. 4.

However, not all sum-of-product functions require eight product terms. If the dedicated OR structure of FIG. 4B is used, any sum-of-products function will consume all of the LUTs in the CLB, even if some of the eight product terms are not needed. FIG. 4C illustrates another embodiment of dedicated OR structure 401 that is not subject to this limitation.

The dedicated OR structure 401b of FIG. 4C includes eight select input circuits SI0–SI7 and 8-input NAND gate 410. One select input circuit is coupled between each input terminal IN0–IN7 and the corresponding input terminal of NAND gate 410. One select input circuit SI0 is illustrated in FIG. 4C. Select input circuits SI1–SI7 are similar to circuit SI0.

Select input circuit SI0 includes a multiplexer 421 that selects between the input signal IN0 and a "0" input signal, i.e., ground or logic low. The selection is controlled in one embodiment by a configuration bit stored in a configuration memory cell 423. The selected signal is passed to inverter 422, which thus provides either the inverted input signal or a logic high level to the associated input terminal of NAND gate 410. If the inverted input signal is provided to NAND gate 410, the LUT providing the input signal provides a product term to the sum-of-products output. If the "0" input is passed by multiplexer 421, a "1" value is provided to NAND gate 401 and is ignored, and the LUT output signal is irrelevant to the sum-of-products output.

Therefore, when embodiment 401b (FIG. 4C) of dedicated OR structure 401 is used in the CLB architecture of FIG. 4, any LUTs that are not needed for the sum-of-products function can be used for other purposes.

Note that LUTs of any size can be used in the pictured embodiments, depending on the number of AND inputs deemed most useful in the sum-of-products functions implemented by PLD users in conjunction with other design limitations. Also, while the pictured embodiments illustrate logic in each slice similar to that of the Virtex-II slice shown in FIG. 1, this logic is merely exemplary in nature, and is not relevant to the present invention nor limiting thereto.

Further, the exemplary embodiments included herein illustrate CLBs that include eight LUTs organized into four slices. However, the number of LUTs per slice and the number of slices per CLB can vary. Additionally, the LUTs need not necessarily be organized into slices.

Figure 5:
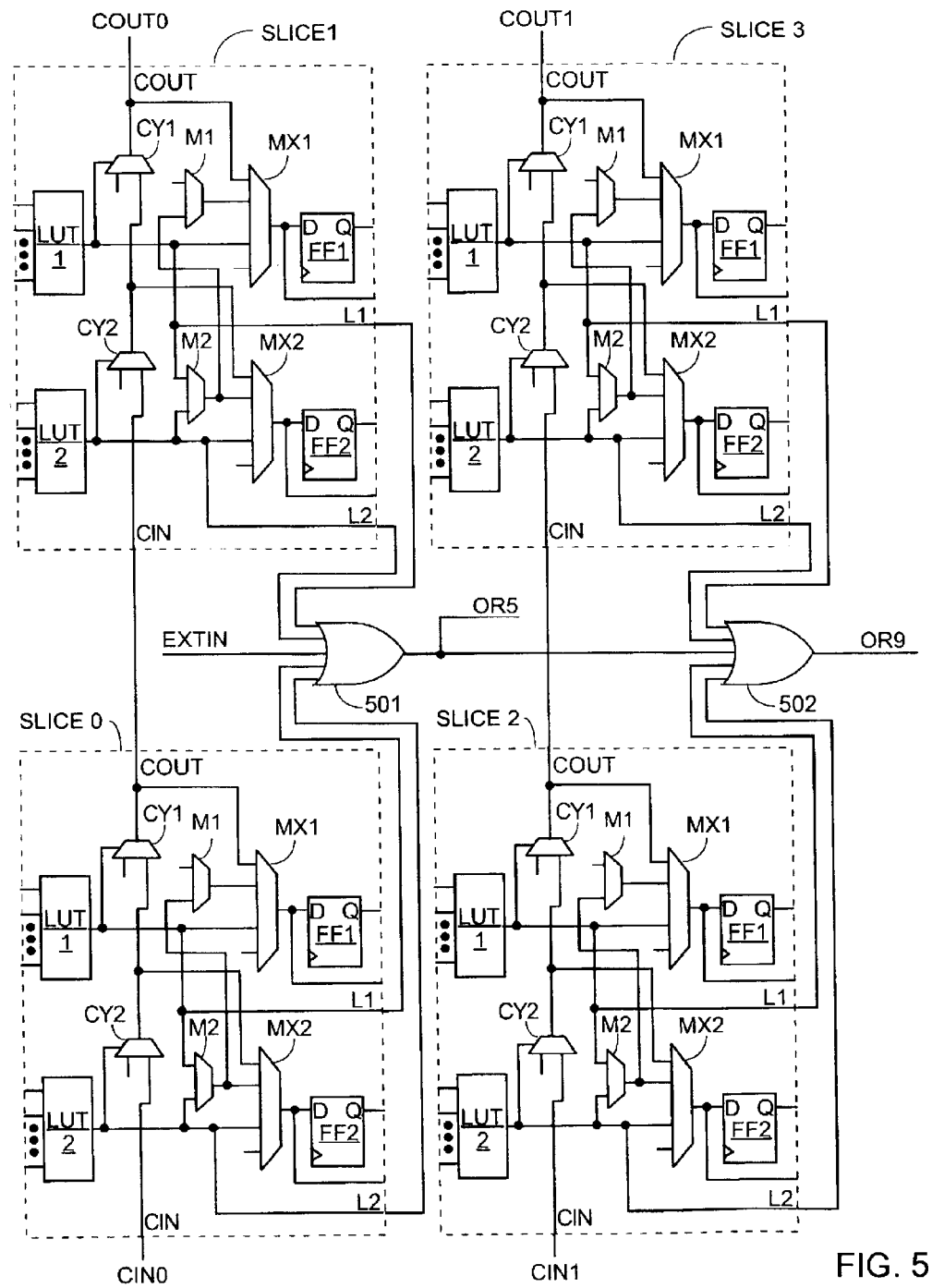
FIG. 5 is a simplified diagram of a second CLB architecture according to a second embodiment of the present invention.

FIG. 5 shows a second CLB architecture according to another embodiment of the invention. In this exemplary embodiment, each slice in FIG. 5 is similar to the slices used in the architecture of FIG. 4. However, in this embodiment, the slices are paired, and the LUT output signals are ORed together within each pair of slices.

Slices SLICE 0 and SLICE 1 form a first pair of slices. The output signals from the four LUTs within these two slices are provided to dedicated OR structure 501, which provides an output signal OR5. A fifth input signal EXTIN is also provided to dedicated OR structure 501. In one embodiment, input signal EXTIN is provided by a source external to the CLB, e.g., from the BY input terminal of a slice similar to the Virtex-II slice. In another embodiment, input signal EXTIN is provided from another node internal to the CLB. In yet another embodiment, the input terminal EXTIN is coupled to the output terminal OR9 from an adjacent CLB. In some embodiments (not shown), input signal EXTIN is omitted, and dedicated OR structure 501 has only four input terminals.

Slices SLICE 2 and SLICE 3 form a second pair of slices. The output signals from the four LUTs within these two slices are provided to dedicated OR structure 502. A fifth input signal OR5 is provided by the dedicated OR structure 501 within the first pair of slices. Thus, the output signal OR9 of dedicated OR structure 502 constitutes a sum-of-products function of the eight LUTs in the CLB and a ninth input signal EXTIN.

Dedicated OR structures 501 and 502 can be implemented, for example, in a fashion similar to the dedicated OR structures shown in FIGS. 4B and 4C, but with fewer inputs, inverters, and select input circuits. As in the embodiment of FIG. 4, when the dedicated OR structure of FIG. 4C is used, LUTs not needed for implementing the sum-of-products function can be used for other purposes by appropriately programming the configuration memory cells of the dedicated OR structures.

Figure 5A:
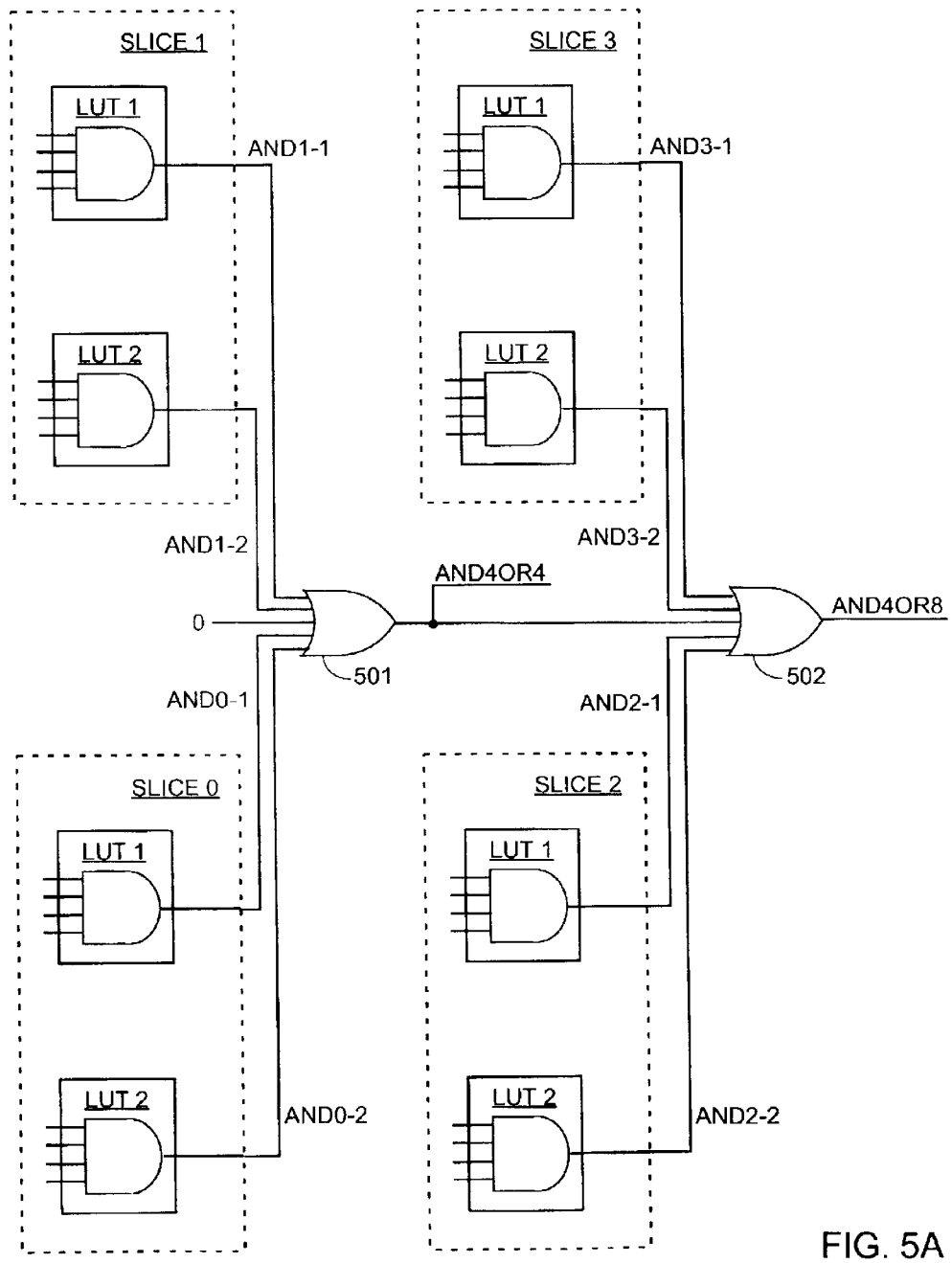
FIG. 5A illustrates the implementation of a sum-of-products function in the CLB of FIG. 5.

FIG. 5A shows how a sum-of-products function can be implemented in the CLB of FIG. 5. Each LUT is configured as an AND gate. The AND output signals from SLICE 0 and SLICE 1 are passed to dedicated OR structure 501. In the pictured embodiment, the fifth input signal EXTIN is held to a low value. Alternatively, dedicated OR structure 501 can be programmed to ignore the value on the EXTIN input terminal. Dedicated OR structure 501 provides a sum-of-products output AND4OR4 for the four product terms provided by the LUTS in slices SLICE 0 and SLICE 1.

Similarly, the AND output signals from SLICE 2 and SLICE 3 are passed to dedicated OR structure 502. The fifth input signal is the output signal AND4OR4 from dedicated OR structure 501. Thus, dedicated OR structure 502 provides a sum-of-products output AND4OR8 for the eight product terms provided by the LUTs in all four slices.

Figure 6:
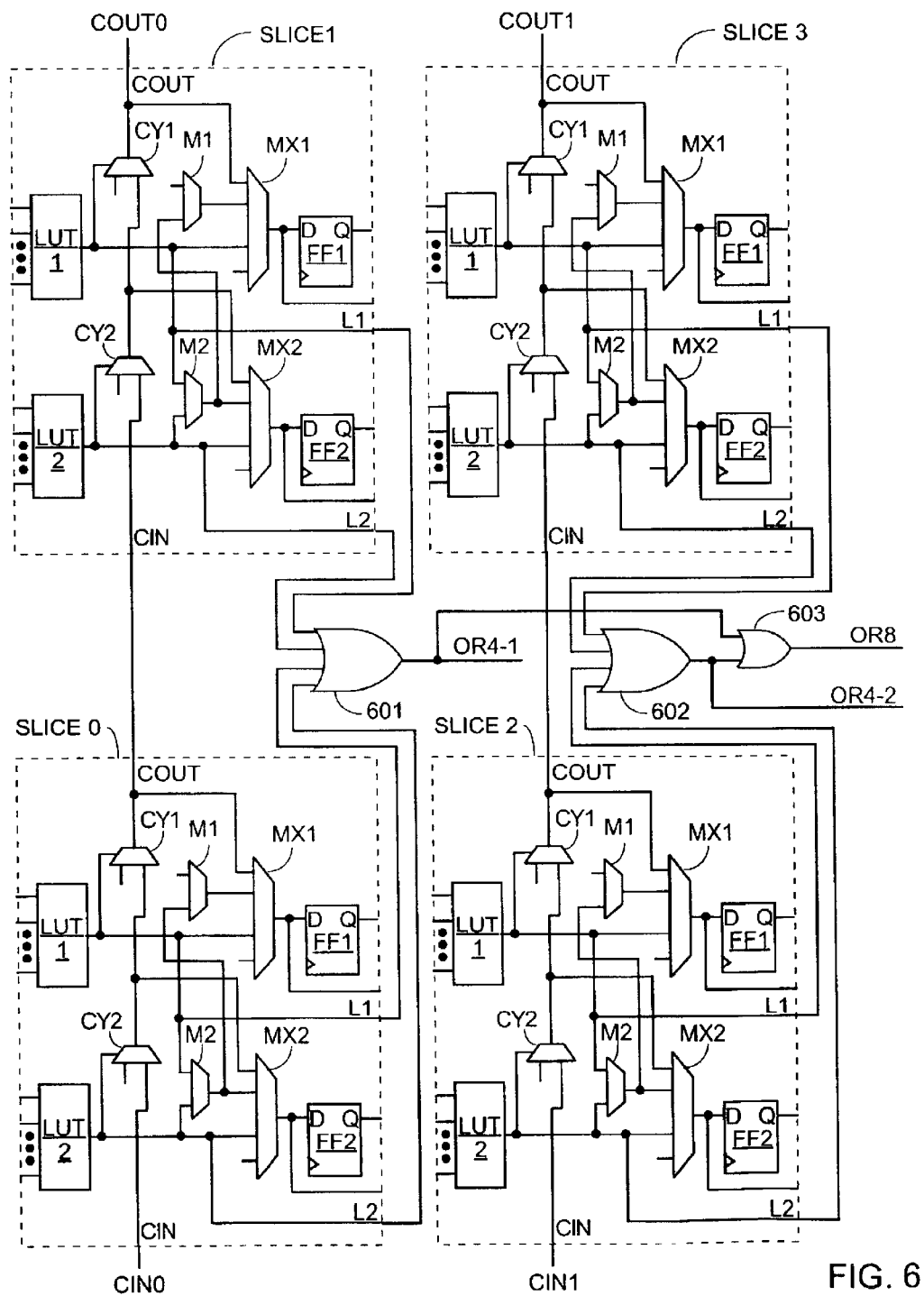
FIG. 6 is a simplified diagram of a third CLB architecture according to a third embodiment of the present invention.

FIG. 6 shows a third CLB architecture according to another embodiment of the invention. In this exemplary embodiment, each slice in FIG. 6 is similar to the slices used in the architectures of FIGS. 4 and 5. The slices are paired as in the embodiment of FIG. 5, and the LUT output signals are ORed together within each pair of slices. The OR outputs from each pair of slices are then combined in a third OR circuit to generate the sum-of-products output for the entire CLB.

Slices SLICE 0 and SLICE 1 form a first pair of slices. The output signals from the four LUTs within these two slices are provided to dedicated OR structure 601, which provides an output signal OR4-1. Slices SLICE 2 and SLICE 3 form a second pair of slices. The output signals from the four LUTs within these two slices are provided to dedicated OR structure 602, which provides an output signal OR4-2. Signals OR4-1 and OR4-2 are provided to a logical OR circuit 603, which in turn provides the sum-of-products function of the eight LUTs in the CLB.

Figure 6A:
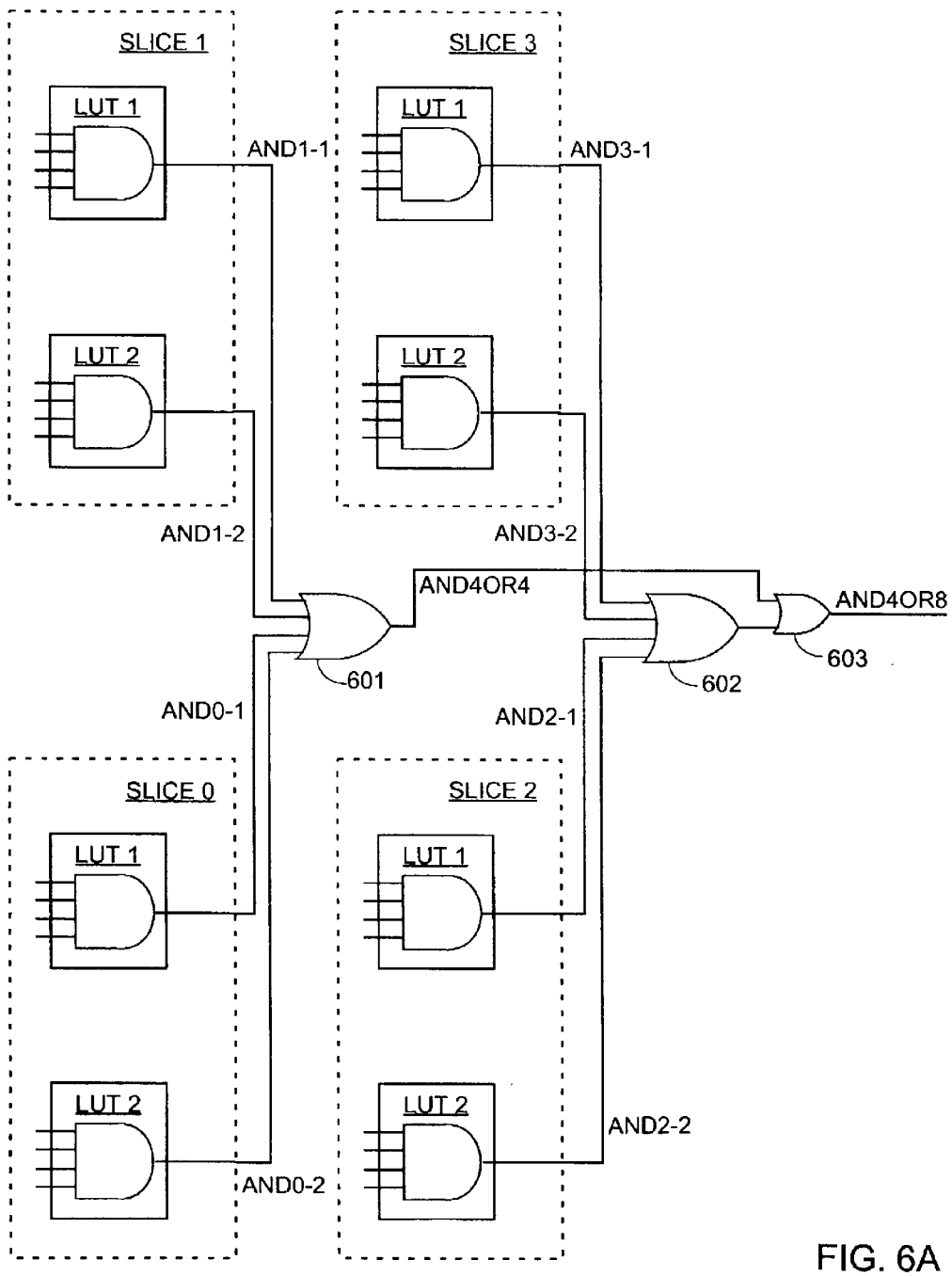
FIG. 6A illustrates the implementation of a sum-of-products function in the CLB of FIG. 6.

FIG. 6A shows how a sum-of-products function can be implemented in the CLB of FIG. 6. Each LUT is configured as an AND gate. The AND output signals from SLICE 0 and SLICE 1 are passed to dedicated OR structure 601. Dedicated OR structure 601 provides a sum-of-products output AND4OR4 for the four product terms provided by the LUTs in slices SLICE 0 and SLICE 1.

Similarly, the AND output signals from SLICE 2 and SLICE 3 are passed to dedicated OR structure 602. The output signals from dedicated OR structures 601 and 602 are provided to logical OR circuit 603, which in turn provides a sum-of-products output AND4OR8 for the eight product terms provided by the LUTs in all four slices.

Dedicated OR structures 601 and 602 can be implemented, for example, in a fashion similar to the dedicated OR structures shown in FIGS. 4B and 4C, but with fewer inputs, inverters, and select input circuits. As in the embodiments of FIGS. 4 and 5, when the dedicated OR structure of FIG. 4C is used, LUTs not needed for implementing the sum-of-products function can be used for other purposes by appropriately programming the configuration memory cells of the dedicated OR structures. Logical OR circuit 603 can also be implemented in a fashion similar to the dedicated OR structures shown in FIGS. 4B and 4C, but with fewer inputs, inverters, and select input circuits.

Figure 6B:
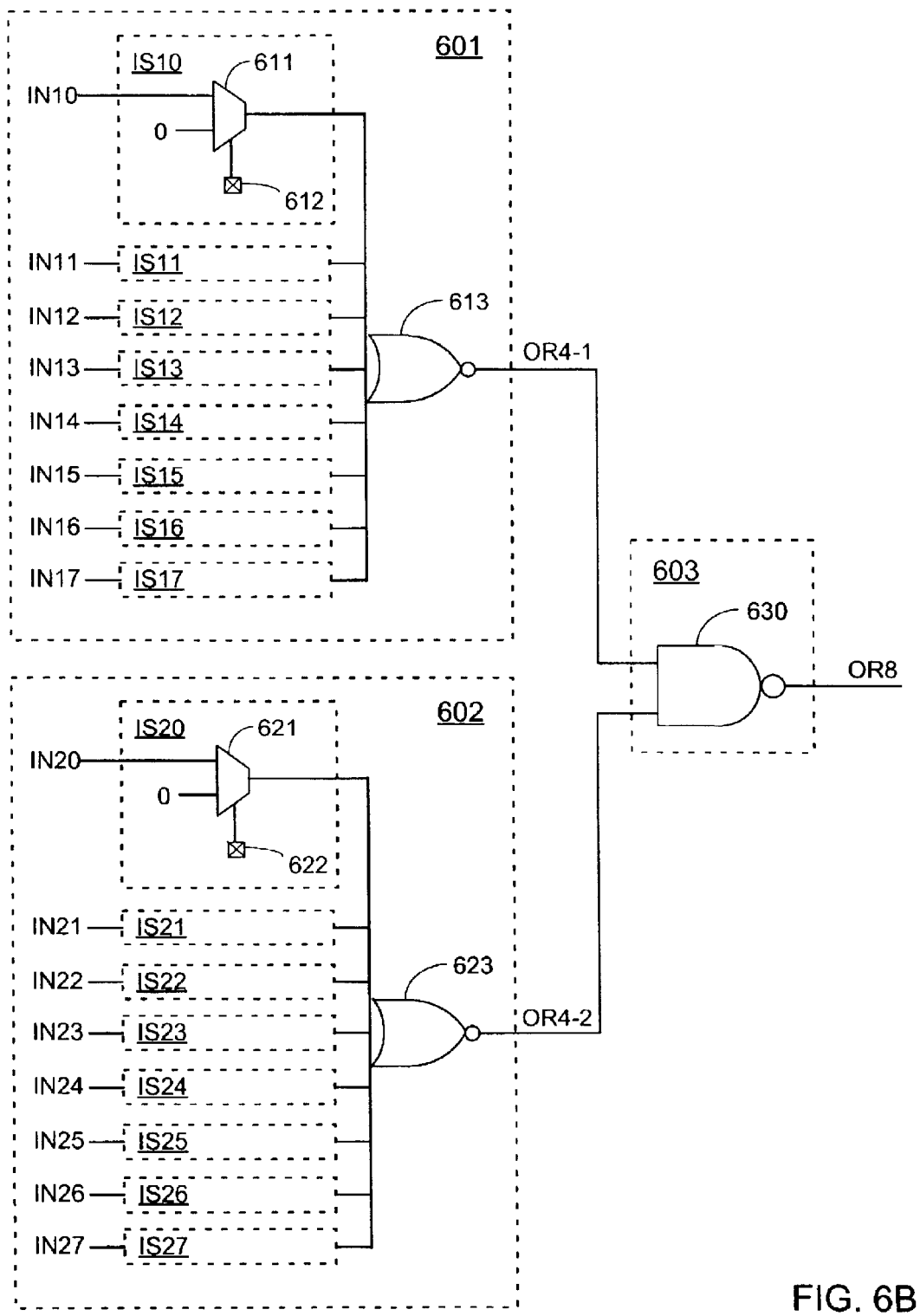
FIG. 6B shows one implementation of the dedicated OR structures and logical OR circuit that can be used in the CLB of FIG. 6.

In one embodiment, dedicated OR structures 601 and 602 and logical OR circuit 603 are implemented as shown in FIG. 6B. In the pictured embodiment, dedicated OR structures 601 and 602 are implemented in a similar fashion. Therefore, only dedicated OR structure 601 is described here. Dedicated OR structure 601 includes eight input select circuits IS10–IS17 and an 8-input NOR gate 613. One input select circuit IS10–IS17 is coupled between each input terminal IN10–IN17 and the corresponding input terminal of NOR gate 613. One input select circuit IS10 is illustrated in FIG. 6B; the other input select circuits are similar to circuit IS10.

Input select circuit IS10 includes a multiplexer 611 that selects between the input signal IN10 and a "0" input, i.e., ground or logic low. The selection is controlled in one embodiment by a configuration bit stored in a configuration memory cell 612. Thus, either the input signal or a logic low level is provided to the associated input terminal of NOR gate 613. If the input signal is provided to NOR gate 613, the LUT providing the input signal provides a product term to the sum-of-products output. If multiplexer 611 is configured to pass the "0" input, the "0" value is ignored by NOR gate 613, and the LUT output signal is irrelevant to the sum-of-products output.

The output signal OR4-1 from dedicated OR structure 601 and the output signal OR4-2 from dedicated OR structure 602 are provided to logical OR circuit 603, which is implemented in this embodiment as a NAND gate 630. NAND gate 630 thus provides sum-of-products output signal OR8.

Note that as the term is used herein, NAND gate 630 is a "logical OR circuit", because NAND gate 630 provides a logical OR output for the sum-of-products function. Referring again to FIG. 6, logical OR circuit 603 is implemented as a NAND gate with inverted inputs. The inversions are performed by "pushing the bubbles" from the input terminals of NAND gate 630 back to dedicated OR structures 601 and 602, using a technique well known in the art of logic design. Hence, dedicated OR structures 601 and 602 are implemented using NOR gates 613 and 623.

As with other CLB architectures, sum-of-products results provided by the exemplary CLBs illustrated herein can be combined to provide deeper and wider sum-of-products functions, using techniques well known in the art of logic design. For example, the sum-of-products output signals can be combined using LUTs in other CLBs, or in unused portions of the same CLB, configured to provide the desired logical combination of the CLB sum-of-products results.

Those having skill in the relevant arts of the invention will now perceive various modifications and additions that can be made as a result of the disclosure herein. For example, dedicated OR structures, logical OR circuits, OR gates, NOR gates, AND gates, NAND gates, inverters, multiplexers, FPGAs, CLBs, slices, LUTs, and other components other than those described herein can be used to implement the invention. Further, OR gates, NOR gates, AND gates, and NAND gates can be replaced by their logical equivalents, as is well known in the art of logic design.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A configurable logic block (CLB) for a programmable logic device (PLD), the CLB comprising:
   an external input terminal;
   a first plurality of configurable lookup tables (LUTs), each having a plurality of input terminals and an output terminal; and
   a first dedicated OR structure, the first dedicated OR structure having a plurality of input terminals and an output terminal,
   wherein the output terminal of each of the first plurality of LUTs is directly coupled to a different one of the input terminals of the first dedicated OR structure, and wherein the first dedicated OR structure further has an input terminal coupled to the external input terminal of the CLB.

2. The CLB of claim 1, wherein the first plurality of LUTs comprises eight LUTs.

3. The CLB of claim 1, wherein the first plurality of LUTs comprises four LUTs.

4. The CLB of claim 1, wherein the first dedicated OR structure is implemented as a NAND gate with inverted inputs.

5. The CLB of claim 1, wherein the first dedicated OR structure is configurable to selectively combine the signals from the first plurality of LUTs.

6. A configurable logic block (CLB) for a programmable logic device (PLD), the CLB comprising:
   a first plurality of configurable lookup tables (LUTs), each having a plurality of input terminals and an output terminal; and
   a first dedicated OR structure, the first dedicated OR structure having a plurality of input terminals and an output terminal,
   wherein the output terminal of each of the first plurality of LUTs is directly coupled to a different one of the input terminals of the first dedicated OR structure,
   wherein the first dedicated OR structure is configurable to selectively combine the signals from the first plurality of LUTs; and
   wherein the first dedicated OR structure comprises:
      a plurality of configuration memory cells;
      a plurality of multiplexers, each multiplexer having a first data input terminal coupled to an associated input terminal of the first dedicated OR structure, a second data input terminal coupled to a ground, a select terminal coupled to an associated configuration memory cell, and an output terminal;
      a plurality of inverters each having an input terminal coupled to the output terminal of an associated multiplexer, each inverter further having an output terminal; and
      a NAND gate having a plurality of input terminals coupled to the output terminals of the inverters and further having an output terminal coupled to the output terminal of the first dedicated OR structure.

7. A configurable logic block (CLB) for a programmable logic device (PLD), the CLB comprising:
   a first plurality of configurable lookup tables (LUTs), each having a plurality of input terminals and an output terminal;
   a first dedicated OR structure, the first dedicated OR structure having a plurality of input terminals and an output terminal, wherein the output terminal of each of the first plurality of LUTs is directly coupled to a different one of the input terminals of the first dedicated OR structure;
   a second plurality of LUTs, each having a plurality of input terminals and an output terminal; and
   a second dedicated OR structure, the second dedicated OR structure having a plurality of input terminals and an output terminal,
   wherein the output terminal of each of the second plurality of LUTs is directly coupled to a different one of the input terminals of the second dedicated OR structure, and
   wherein the second dedicated OR structure further has an input terminal coupled to the output terminal of the first dedicated OR structure.

8. The CLB of claim 7, wherein the first and second pluralities of LUTs each comprise four LUTs.

9. The CLB of claim 7, further comprising an external input terminal, wherein the first dedicated OR structure further has an input terminal coupled to the external input terminal of the CLB.

10. The CLB of claim 7, wherein the first and second dedicated OR structures are implemented as NAND gates with inverted inputs.

11. The CLB of claim 7, wherein the first and second dedicated OR structures are each configurable to selectively combine the signals from the associated plurality of LUTs.

12. The CLB of claim 11, wherein the first and second dedicated OR structures each comprise:
   a plurality of configuration memory cells;
   a plurality of multiplexers, each multiplexer having a first data input terminal coupled to an associated input terminal of the dedicated OR structure, a second data input terminal coupled to a ground, a select terminal coupled to an associated configuration memory cell, and an output terminal;
   a plurality of inverters each having an input terminal coupled to the output terminal of an associated multiplexer, each inverter further having an output terminal; and
   a NAND gate having a plurality of input terminals coupled to the output terminals of the inverters and further having an output terminal coupled to the output terminal of the dedicated OR structure.

13. A configurable logic block (CLB) for a programmable logic device (PLD), the CLB comprising:
   a first plurality of configurable lookup tables (LUTs), each having a plurality of input terminals and an output terminal;
   a first dedicated OR structure, the first dedicated OR structure having a plurality of input terminals and an output terminal, wherein the output terminal of each of the first plurality of LUTs is directly coupled to a different one of the input terminals of the first dedicated OR structure;
   a second plurality of LUTs, each having a plurality of input terminals and an output terminal;
   a second dedicated OR structure, the second dedicated OR structure having a plurality of input terminals and an output terminal, wherein the output terminal of each of the second plurality of LUTs is directly coupled to a different one of the input terminals of the second dedicated OR structure; and
   a logical OR circuit, the logical OR circuit having a first input terminal coupled to the output terminal of the first dedicated OR structure and a second input terminal coupled to the output terminal of the second dedicated OR structure.

14. The CLB of claim 13, wherein the first and second pluralities of LUTs each comprise four LUTs.

15. The CLB of claim 13, wherein the first and second dedicated OR structures are implemented as NAND gates with inverted inputs.

16. The CLB of claim 13, wherein the first and second dedicated OR structures are each configurable to selectively combine the signals from the associated plurality of LUTs.

17. The CLB of claim 16, wherein the first and second dedicated OR structures each comprise:
   a plurality of configuration memory cells;
   a plurality of multiplexers, each multiplexer having a first data input terminal coupled to an associated input terminal of the dedicated OR structure, a second data input terminal coupled to a ground, a select terminal coupled to an associated configuration memory cell, and an output terminal;

a plurality of inverters each having an input terminal coupled to the output terminal of an associated multiplexer, each inverter further having an output terminal; and a NAND gate having a plurality of input terminals coupled to the output terminals of the inverters and further having an output terminal coupled to the output terminal of the dedicated OR structure.

18. A configurable logic block (CLB) for a programmable logic device (PLD), the CLB comprising:

a first sub-circuit having an input terminal and an output terminal; and a second sub-circuit having an input terminal coupled to the output terminal of the first sub-circuit and further having an output terminal, wherein each sub-circuit comprises:
  a plurality of configurable lookup tables (LUTs), each having a plurality of input terminals and an output terminal; and
  a dedicated OR structure having a plurality of input terminals of which one input terminal is coupled to the input terminal of the sub-circuit, and further having an output terminal coupled to the output terminal of the sub-circuit,
  wherein the output terminal of each of the plurality of LUTs is directly coupled to a different one of the input terminals of the dedicated OR structure.

19. The CLB of claim 18, wherein in each sub-circuit the plurality of LUTs comprises four LUTs.

20. The CLB of claim 18, wherein in each sub-circuit the dedicated OR structure is implemented as a NAND gate with inverted inputs.

21. The CLB of claim 18, wherein in each sub-circuit the dedicated OR structure is configurable to selectively combine the signals from the plurality of LUTs.

22. The CLB of claim 21, wherein in each sub-circuit the dedicated OR structure comprises:

a plurality of configuration memory cells;

a plurality of multiplexers, each multiplexer having a first data input terminal coupled to an associated input terminal of the dedicated OR structure, a second data input terminal coupled to a ground, a select terminal coupled to an associated configuration memory cell, and an output terminal;

a plurality of inverters each having an input terminal coupled to the output terminal of an associated multiplexer, each inverter further having an output terminal; and a NAND gate having a plurality of input terminals coupled to the output terminals of the inverters and further having an output terminal coupled to the output terminal of the dedicated OR structure.

23. A configurable logic block (CLB) for a programmable logic device (PLD), the CLB comprising:

a first sub-circuit having an output terminal;

a second sub-circuit having an output terminal; and a logical OR circuit having a first input terminal coupled to the output terminal of the first sub-circuit and a second input terminal coupled to the output terminal of the second sub-circuit, wherein each sub-circuit comprises:

a plurality of configurable lookup tables (LUTs), each having a plurality of input terminals and an output terminal; and a dedicated OR structure having a plurality of input terminals and an output terminal coupled to the output terminal of the sub-circuit, wherein the output terminal of each of the plurality of LUTs is directly coupled to a different one of the input terminals of the dedicated OR structure.

24. The CLB of claim 23, wherein in each sub-circuit the plurality of LUTs comprises four LUTs.

25. The CLB of claim 23, wherein in each sub-circuit the dedicated OR structure is implemented as a NAND gate with inverted inputs.

26. The CLB of claim 23, wherein in each sub-circuit the dedicated OR structure is configurable to selectively combine the signals from the plurality of LUTS.

27. The CLB of claim 26, wherein in each sub-circuit the dedicated OR structure comprises:

a plurality of configuration memory cells;

a plurality of multiplexers, each multiplexer having a first data input terminal coupled to an associated input terminal of the dedicated OR structure, a second data input terminal coupled to a ground, a select terminal coupled to an associated configuration memory cell, and an output terminal;

a plurality of inverters each having an input terminal coupled to the output terminal of an associated multiplexer, each inverter further having an output terminal; and a NAND gate having a plurality of input terminals coupled to the output terminals of the inverters and further having an output terminal coupled to the output terminal of the dedicated OR structure.

28. A programmable logic device (PLD), comprising:

a plurality of configurable logic blocks (CLBs);

a plurality of input/output blocks (IOBs); and an interconnect structure programmably interconnecting the CLBs and IOBs, wherein each CLB comprises:
  an input terminal coupled to the interconnect structure;
  a plurality of configurable lookup tables (LUTs), each having a plurality of input terminals and an output terminal; and
  a dedicated OR structure, the first dedicated OR structure having a plurality of input terminals and an output terminal, the output terminal of each of the plurality of LUTs being directly coupled to a different one of the input terminals of the dedicated OR structure,
  wherein the first dedicated OR structure further has an input terminal coupled to the input terminal of the CLB.

29. A programmable system, comprising:

a memory circuit wherein a configuration bitstream is stored; and a programmable logic device (PLD) coupled to receive the configuration bitstream from the memory circuit, the PLD comprising a plurality of configurable logic blocks (CLBs) configured by data from the configuration bitstream, each CLB comprising:
  an external input terminal;
  a plurality of configurable lookup tables (LUTs), each having a plurality of input terminals and an output terminal; and a dedicated OR structure having a plurality of input terminals and an output terminal, the output terminal of each of the plurality of LUTs being directly coupled to a different one of the input terminals of the dedicated OR structure, wherein the first dedicated OR structure further has an input terminal coupled to the external input terminal of the CLB.

* * * * *